United States Patent
Baek et al.

(10) Patent No.: US 7,106,938 B2
(45) Date of Patent: Sep. 12, 2006

(54) SELF ASSEMBLED THREE-DIMENSIONAL PHOTONIC CRYSTAL

(75) Inventors: Kang-Hyun Baek, Minneapolis, MN (US); Anand Gopinath, Wayzata, MN (US); H. Aaron Christmann, White Bear Lake, MN (US)

(73) Assignees: Regents of the University of Minnesota, Minneapolis, MN (US); 3M Innovative Properties Company, St. Paul, MN (US)

( * ) Notice: Subject to any disclaimer, the term of this patent is extended or adjusted under 35 U.S.C. 154(b) by 212 days.

(21) Appl. No.: 10/801,940

(22) Filed: Mar. 16, 2004

(65) Prior Publication Data

US 2005/0206020 A1    Sep. 22, 2005

(51) Int. Cl.
*G02B 6/10*    (2006.01)
*H01L 21/00*    (2006.01)

(52) U.S. Cl. .................. 385/131; 385/14; 385/129; 385/130; 438/29; 438/31

(58) Field of Classification Search .............. 385/122, 385/123, 14, 129, 130, 131; 65/385; 438/29, 438/31

See application file for complete search history.

(56) References Cited

U.S. PATENT DOCUMENTS

| | | | | |
|---|---|---|---|---|
| 6,139,626 A | 10/2000 | Norris et al. | ............. | 117/68 |
| 6,228,340 B1 | 5/2001 | Imhof et al. | ............. | 423/338 |
| 6,261,469 B1 | 7/2001 | Zakhidov et al. | ........... | 216/56 |
| 6,414,043 B1 | 7/2002 | Asher et al. | ............. | 521/61 |
| 6,436,187 B1 | 8/2002 | Patel et al. | ............. | 117/68 |
| 6,517,763 B1 | 2/2003 | Zakhidov et al. | ......... | 264/344 |
| 6,555,945 B1 | 4/2003 | Baughman et al. | ....... | 310/300 |
| 6,563,981 B1 | 5/2003 | Weisberg et al. | ........... | 385/28 |
| 6,589,629 B1 | 7/2003 | Bao et al. | ............. | 428/144 |
| 6,625,364 B1 | 9/2003 | Johnson et al. | ........... | 385/127 |
| 6,680,013 B1 | 1/2004 | Stein et al. | ............. | 264/44 |
| 6,797,057 B1 * | 9/2004 | Amos et al. | ............. | 117/68 |
| 6,800,709 B1 * | 10/2004 | Aert et al. | ............. | 526/229 |
| 6,858,079 B1 * | 2/2005 | Norris et al. | ............. | 117/70 |
| 6,863,847 B1 * | 3/2005 | Fu et al. | ............. | 264/1.21 |
| 6,898,362 B1 * | 5/2005 | Forbes et al. | ............. | 385/132 |
| 2001/0019037 A1 | 9/2001 | Zakhidov et al. | ........... | 216/56 |
| 2002/0024163 A1 | 2/2002 | Fu et al. | ............. | 264/42 |
| 2002/0045030 A1 | 4/2002 | Ozin et al. | ............. | 428/173 |
| 2002/0062782 A1 | 5/2002 | Norris et al. | ............. | 117/3 |
| 2002/0126713 A1 | 9/2002 | Ibanescu et al. | ............ | 372/6 |

(Continued)

FOREIGN PATENT DOCUMENTS

EP    1 081 513 A1    3/2001    ............. 385/122 X (Continued)

OTHER PUBLICATIONS

Notification of Transmittal of the International Search Report and the Written Opinion of the International Search Authority for PCT/US2005/007569.

(Continued)

*Primary Examiner*—Brian M. Healy
(74) *Attorney, Agent, or Firm*—Westman, Champlin & Kelly, P.A.

(57) ABSTRACT

A method of making a photonic crystal includes obtaining single spheres for use in making a self assembled opal structure. Spherical particles are placed centrifuge and separated from doublets using a relative difference in sedimentation velocity in response to centrifugal force. A method includes drawing a substrate through a meniscus at a declination to uniformly deposit spheres on the substrate. Three-dimensional photonic crystals including buried waveguides are also provided.

12 Claims, 13 Drawing Sheets

U.S. PATENT DOCUMENTS

| | | | |
|---|---|---|---|
| 2002/0164137 A1 | 11/2002 | Johnson et al. | 385/125 |
| 2002/0173610 A1 | 11/2002 | Aert et al. | 526/303.1 |
| 2002/0176676 A1 | 11/2002 | Johnson et al. | 385/125 |
| 2002/0189947 A1 | 12/2002 | Paul et al. | 204/461 |
| 2002/0195344 A1 | 12/2002 | Neyer et al. | 204/600 |
| 2003/0008771 A1 | 1/2003 | Fu et al. | 502/159 |
| 2003/0012657 A1 | 1/2003 | Marr et al. | 417/48 |
| 2003/0020399 A1 | 1/2003 | Moller et al. | 313/504 |
| 2003/0021518 A1 | 1/2003 | Smirnov et al. | 385/15 |
| 2003/0031407 A1 | 2/2003 | Weisberg et al. | 385/28 |
| 2003/0063426 A1 | 4/2003 | Smirnov et al. | 361/159 |
| 2003/0103721 A1 | 6/2003 | Padmanabhan et al. | 385/24 |
| 2003/0136946 A1 | 7/2003 | Kumacheva | 252/500 |
| 2003/0143081 A1 | 7/2003 | Rakestraw et al. | 417/48 |
| 2003/0148088 A1 | 8/2003 | Padmanabhan et al. | 428/304.4 |
| 2003/0156319 A1 | 8/2003 | John et al. | 359/341.5 |
| 2003/0185505 A1 | 10/2003 | Weisberg et al. | 385/28 |
| 2003/0206806 A1 | 11/2003 | Paul et al. | 417/48 |
| 2004/0013379 A1 | 1/2004 | Johnson et al. | 385/125 |
| 2004/0017834 A1 | 1/2004 | Sundar et al. | 372/39 |
| 2004/0020423 A1 | 2/2004 | Lewis, III et al. | 117/8 |

FOREIGN PATENT DOCUMENTS

| | | | | |
|---|---|---|---|---|
| EP | 1 247 820 A1 | 10/2002 | | 385/122 X |
| WO | WO 99/01766 | 1/1999 | | 385/122 X |
| WO | WO 99/47570 | 9/1999 | | 385/122 X |
| WO | WO 00/21905 | 4/2000 | | 385/122 X |
| WO | WO 00/50771 | 8/2000 | | 385/122 X |
| WO | WO 01/18283 A1 | 3/2001 | | 385/122 X |
| WO | WO 01/55484 A2 | 8/2001 | | 385/122 X |
| WO | WO 01/62830 A2 | 8/2001 | | 385/122 X |
| WO | WO 01/66833 A1 | 9/2001 | | 385/122 X |
| WO | WO 01/86038 A2 | 11/2001 | | 385/122 X |
| WO | WO 01/96635 A2 | 12/2001 | | 385/122 X |
| WO | WO 02/33461 A2 | 4/2002 | | 385/122 X |
| WO | WO 02/44301 A2 | 6/2002 | | 385/122 X |
| WO | WO 02/059656 A2 | 8/2002 | | 385/122 X |
| WO | WO 02/059663 A1 | 8/2002 | | 385/122 X |
| WO | WO 02/061467 A2 | 8/2002 | | 385/122 X |
| WO | WO 02/091028 A2 | 11/2002 | | 385/122 X |
| WO | WO 02/101474 A2 | 12/2002 | | 385/122 X |
| WO | WO 03/007663 A1 | 1/2003 | | 385/122 X |
| WO | WO 04/009724 A2 | 1/2004 | | 385/122 X |
| WO | WO 04/013383 A1 | 2/2004 | | 385/122 X |

OTHER PUBLICATIONS

"High-Resolution Particle Separation by Sedimentation Field-Flow Fractionation", by F. Yang et al., *Journal of Colloid and Interface Science*, vol. 60, No. 3, Jul. 1, 1977, pp. 574-577.

"Synthetic Opals Made by the Langmuir-Blodgett Method", by M. Bardosova et al., *Preparation and Characterization, Elsevier Sequoia, NL*, vol. 437, No. 1-2, Aug. 1, 2003, pp. 276-279.

"A Three-Dimensional Optical Photonic Crystal", by S. Lin et al., *Journal of Lightwave Technology*, vol. 17, No. 11, Nov. 1999, pp. 1944-1947.

Invitation to Pay Additional Fees/Communication Relating to the Results of the Partial International Search for PCT/US2005/007569.

S. Noda, K. Tomoda, N. Yamanoto, A. Chutinan, "Full three-dimensional photonic bandgap crystals at near-infrared wavelengths", *Science*, vol. 289, pp. 604-606, Jul., 2000.

Y.A. Vlasov, X.-Z. Bo, J.C. Sturm, D.J. Norris, "On-chip natural assembly of silicon photonic bandgap crystals", *Nature*, vol. 414, pp. 289-293, Nov. 2001.

G.H. Bogush, M.A. Tracy, C.F. Zukoski IV, "Preparation of monodisperse silica particles: Control of size and mass fraction", *J. Non-Crystalline Solids*, vol. 104, pp. 95-106, 1988.

S.L. Chen, P. Dong, G.-H. Yang, J.-J. Yang, "Characteristic aspects of formation of new particles during the growth of monosize silica seeds", *Journal of Colloid and Interface Science*, vol. 180, pp. 237-241, 1996.

W. Stober, A. Fink, E. Bohn, "Controlled growth of monodisperse silica spheres in the micron size range", *J. Colloid and Interf. Sci.*, vol. 26, pp. 62-69, 1968.

D.W. McComb, B.M. Treble, C.J. Smith, R.M. De La Rue and N. P. Johnson, "Synthesis and characterization of photonic crystals", *J. Mater. Chem.*, vol. 11, pp. 142-148, 2001.

P. Ni, P. Dong, B. Cheng, X. Li, D. Zhang, "Synthetic SiO2 opals", *Adv. Mater.* vol. 13, pp. 437-441, Mar. 2001.

P. Jiang, J.F. Bertone, K.S. Hwang, V.L. Colvin, "Single-Crystal colloidal multilayers of controlled thickness", *Chem. Mater.*, vol. 11, pp. 2132-2140, 1999.

C.F. Blanford, R.C. Schroden, M. Al-Daous, A. Stein, "Tuning solvent-dependent color changes of three-dimensionally ordered macroporous (3DOM) materials through compositional and geometric modifications", *Adv. Mater.*, vol. 13, pp. 26-29, Jan. 2001.

E. Yablonovich, Inhibited spontaneous emission in solid state physics and electronics, Phys. Rev. Lett., vol. 58, pp. 2059-2062, 1987.

O. Painter, J. Vuckovic, A. Yariv, A. Scherer, J. D. O'Brien, P. D. Dapkus, Two dimensional photonic band gap defect mode laser, Science, vol. 284, pp. 1819-1821, 1999.

E. R. Brown, O. B. McMahon, High zenithal directivity from a dipole antenna on a photonic crystal, Appl. Phys. Lett., vol. 68, pp. 1300-1302, 1996.

B. Temelkuran, M. Bayindir, E. Ozbay, R. Biswas, M. M. Sigalas, G. Tuttle, K. M. Ho, Photonic crystal-based resonant antenna with a very high directivity, J. Appl. Phys., vol. 87, pp. 603-605, 2000.

J. G. Fleming, S-Y, Lin, Three dimensional photonic crystal with a stop band from 1.35 to 1.95μm, Optics Lett., vol. 24, pp. 49-51, 1999.

Special Section on Electromagnetic Crystal Structures, Design, Synthesis, and Applications, Journal of Lightwave Technology, vol. 17, pp. 1944-1947, 1999.

Special issue of Advance Materials, vol. 13, No. 6, p. 369, 2001.

Special Feature Section on Photonic Crystal Structures and applications, IEEE J. Quantum Electronics, vol. 38, Jul. 2002. Dimensional photonic.

S. John, K. Busch, Photonic bandgap formation and tunability in certain self organizing systems, Journal of Lightwave Technology, vol. 17, pp. 1931-1943, 1999.

E. Palacios-Lidon, A. Blanco, M. Ibisate, F. Meseguer, C. Lopez, J. Sanchez-Dehesa, Optical study of the full photonic band gap in silicon inverse opals, Appl. Phys. Lett., vol. 81, No. 21, pp. 4925-4927, 2002.

B. T. Holland, C. F. Blanford, A. Stein, Synthesis of Highly Ordered Three-Dimensional Mineral Honeycombs with Macropores, Science, vol. 281, pp. 538-540, 1998.

H. Yan, C. F. Blandford, B. T. Holland, W. H. Smyrl, A. Stein, General Synthesis of Periodic Macro-porous Solids by Templated Salt Precipitation and Chemical Conversion, Chem. Mater., vol. 12, pp. 1134-1141, 2000.

J. E. G. J. Wijnhoven, W. L. Vos, Preparation of photonic crystals made of air spheres in Titania, Science, vol. 281, pp. 802-804, 1998.

D. J. Norris, Y. A. Vlasov, Chemical Approaches to Three-Dimensional Semiconductor Photonic Crystals, Advanced Materials, vol. 13, Issue 6, pp. 371-376, 2001.

F. J. P. Schuurmans, D. Vanmaekelbergh, J. van de Lagemaat, A. Lagendijk, Strongly Photonic Macroporous Gallium Phosphide Networks. Science vol. 284, pp. 141-143, 1999.

Y. Matsui, M. Ishino, T. Fujita, H. Serizawa, T. Kajiwra, A novel measurement technique of loss and facet reflectivity for semiconductor optical waveguides, SPIEvol. 651, Integrated Optical Circuit Engineering III, 1986.

S. G. Johnson, J. D. Joanopoulos, Block iterative frequency domain method for Maxwell's equations in a plane wave basis, Opt. Express, vol. 8, 173-190, 2001.

P. M. Bell, J. M. Pendry, I. Martin-Moreno, A. J. Ward, A program for calculating photonic band structures and transmission coefficients of complex structures, comput. Phys. commun., vol. 85, pp. 306-322, 1995.

K. R. Williams, R. S. Muller, Etch rates for micromachining processing, J. Microelectromechanical Systems, vol. 5, pp. 256-269, 1996.

"Photonic Band Engineering in Opals by Growth of Si/Ge Multilayer Shells", by F. Garcia-Santamaria et al., Adv. Mater. 2003, 15, No. 10, pp. 788-792.

"Tuning the Properties of Photonic Films from Polymer Beads by Chemistry", by M. Egen et al., Chem. Mater: 2002, 14, pp. 2176-2183.

"Synthesis and Characterization of Monodisperse Core-Shell Colloidal Spheres of Zinc Sulfide and Silica", by K. Velikov et al., Langmuir 2001, 17, pp. 4779-4786.

"Optical coupling between monocrystalline colloidal crystals and a planar waveguide", by Y. Zhao et al., *Applied Physics Letters*, vol. 75, No. 23, pp. 3596-3598, (Dec. 6, 1999).

"Two-dimensional colloidal crystal corrugated waveguides", by Y. Zhao et al., *Optics Letters*, vol. 24, No. 12, pp. 817-819, (Jun. 15, 1999).

"Optical Demultiplexing in a Planar Waveguide with Colloidal Crystal", by I. Avrutsky et al., *IEEE Photonics Technology Letters*, vol. 12, No. 12, pp. 1647-1649, (Dec. 12, 2000).

* cited by examiner

SELF ASSEMBLED THREE-DIMENSIONAL PHOTONIC CRYSTAL

BACKGROUND OF THE INVENTION

The present invention relates to photonic crystals and methods of making photonic crystals. More specifically, the present invention relates to self assembled photonic crystals having opal structures.

Photonic crystals with a photonic bandgap are expected to be used in the variety of applications including optical filters, sharp bending light guides, and very low threshold lasers, and have been investigated widely. Of special interest are three-dimensional photonic crystals, which may have lower loss than two-dimensional photonic crystals of the slab type (see S. Noda, K. Tomoda, N. Yamanoto, A. Chutinan, "Full three-dimensional photonic bandgap crystals at near-infrared wavelengths", Science, vol. 289, pp. 604–606, July, 2000). In general, the fabrication processes of photonic crystals require the use of complicated and expensive semiconductor nanofabrication techniques. An alternative fabrication method for photonic crystals takes the form of self assembled crystalline structures using colloidal spheres (see, Y. A. Vlasov, X.-Z. Bo, J. C. Sturm, D. J. Norris, "On-chip natural assembly of silicon photonic bandgap crystals", Nature, vol. 414, pp. 289–293, November, 2001). The crystalline structure opal has a hexagonal closed-packed or face centered cubic lattice. The opal is removed after infiltration with high refractive index material to obtain the inverse opal, which has a complete three-dimensional photonic bandgap. Inverse opals with a defect can be expected to produce highly efficient filters and low threshold lasers. Therefore, high quality crystalline opals are required to make the inverse opals. For high quality crystalline opals, first, silica spheres should have a required diameter with narrow size distribution, which determines the wavelength of the photonic bandgap (or the maximum reflectance peak on the optical spectrum). Second, during the formation process, aggregation and adhesions between spheres, which results in "doublets" must be avoided. Such formations result in structural defects and dislocations in the final crystal.

SUMMARY OF THE INVENTION

An optical inverse opal structure is provided including a method of obtaining single spheres for use in making self assembled opal structures. In the method, a plurality of spherical particles are placed in a centrifuge and single spheres are separated from doublets using a relative difference to sedimentation velocity in response to centrifugal force. Structures with buried waveguides are also provided including fabrication techniques. In one method, a substrate is drawn at a declination through a meniscus containing suspended spheres to provide a substantial uniform crystal deposition.

DETAILED DESCRIPTION OF THE PREFERRED EMBODIMENTS

Figure 1:
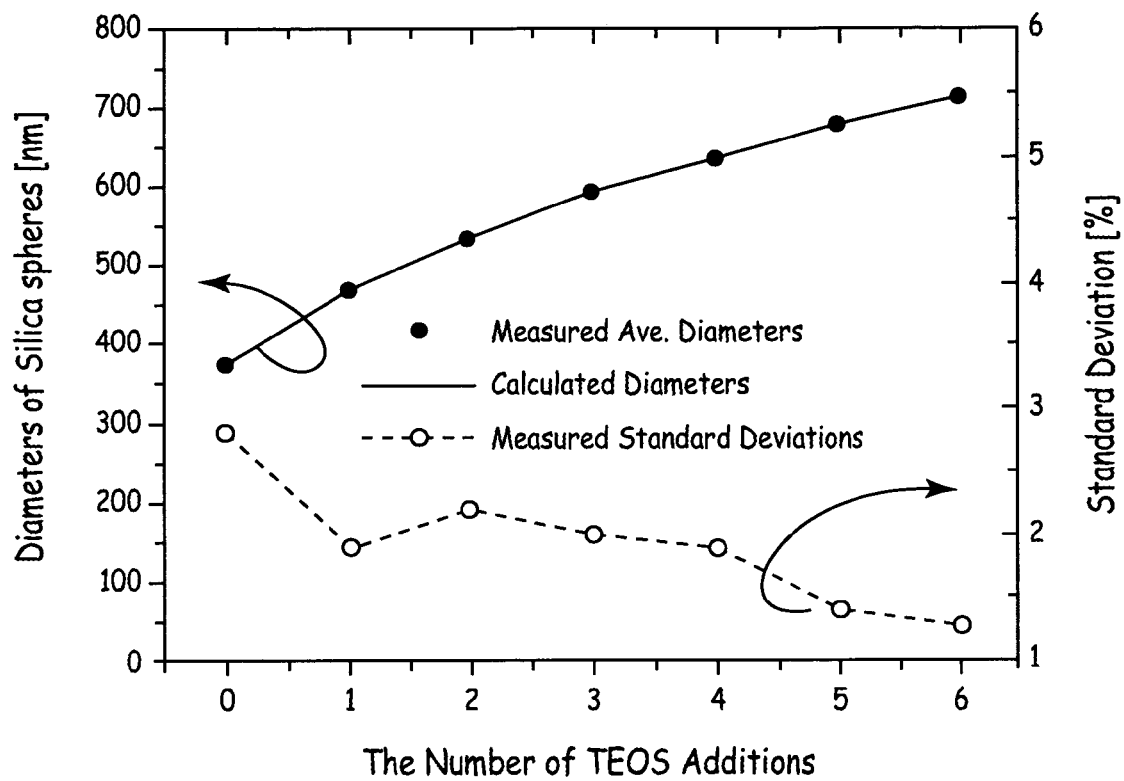
FIG. 1 is a graph of diameter of silica spheres in nanometers in standard deviation and percentage versus a number of TEOS additions showing measured average diameters, calculated diameters and measured standard deviations.

"Photonic Band Gap" (PBG) materials are periodic structures that have pass and stop-bands for the transmission of electromagnetic radiation in specific wavelength bands. Periodic structures have taken the form of air holes in a semiconductor material as originally conceived (see, E. Yablonovich, Inhibited spontaneous emission in solid state physics and electronics, Phys. Rev. Lett., Vol. 58, pp. 2059–2062, 1987). More recently, periodic structures have taken the form of air holes in semiconductors films (see, O. Painter, J. Vuckovic, A. Yariv, A. Scherer, J. D. O'Brien, P. D. Dapkus, Two dimensional photonic band gap defect mode laser, Science, Vol. 284, pp. 1819–1824, 1999) in two dimensions, air holes in dielectric material (see, E. R. Brown, O. B. McMahon, High zenithal directivity from a dipole antenna on a photonic crystal, Appl. Phys. Lett., vol. 68, pp. 1300–1302, 1996), metal rods stacked periodically (see, B. Temelkuran, M. Bayindir, E. Ozbay, R. Biswas, M. M. Sigalas, G. Tuttle, K. M. Ho, Photonic crystal-based resonant antenna with a very high directivity, J. Appl. Phys., Vol. 87, pp. 603–605, 2000), Silicon and tungsten rods stacked periodically (see, J. G. Fleming, S-Y. Lin, Three dimensional photonic crystal with a stop-band from 1.35 to 1.95 µm, Optics Lett., vol. 24, pp. 49–51, 1999), and a host of other approaches. (See, Special Section on Electromagnetic Crystal Structures, Design, Synthesis, and Applications, Journal of Lightwave Technology, Vol. 17, pp. 1931–2207, 1999, Special issue of Advance Materials, Vol.

13, no 6, 2001 and Special Feature Section on Photonic Crystal Structures and applications, IEEE J. Quantum Electronics, Vol 38, July 2002. dimensional photonic). Light emission from these materials has also been discussed from doped opals, optically pumped semiconductor slab resonators, and other material systems.

With the present invention, self assembled colloidal opal and inverse opal photonic band gap structures are provided. The invention further includes opal and inverse opal structures with a waveguide defect carried therein. When monodispersed spheres are allowed to settle, they form face centered cubic (fcc) or "opal" structures, and may also settle into the hexagonal close packed form, although this is not the lowest energy structure. It has been suggested in several papers (see, Special issue of Advance Materials, Vol. 13, no 6, 2001 and S. John, K. Busch, Photonic bandgap formation and tenability in certain self organizing systems, Journal of Lightwave Technology, vol. 17, pp. 1931–1943, 1999) that this colloidal crystal or opal has much too high a filling factor, and therefore only has a pseudo stop-band. A pseudo-stop-band is one in which the frequency is not completely blocked, but attenuated to some value which is typically by about an order of magnitude. The inverse opal is a structure in which the opal acts as a template and the space between the spheres is filled with a suitable dielectric, and the spheres extracted. See, for example Special Section on Electromagnetic Crystal Structures, Design, Synthesis, and Applications, Journal of Lightwave Technology, Vol. 17, pp. 1931–2207, 1999 and Special issue of Advance Materials, Vol. 13, no 6, 2001), and more recently, E. Palacios-Lidon, A. Blanco, M. Ibisate, F. Meseguer, C. Lopez, J. Sanchez-Dehesa, Optical study of the full photonic bandgap in silicon inverse opals, Appl. Phys. Lett., Vol. 81, no. 21, pp. 4925–4927, 2002. These references show that inverse opal have definite stop-bands.

A "defect" in any type of well defined PBG structure becomes a cavity at the appropriate stop-band, and should have an extremely high quality factor (Q). Thus, any radiation in this cavity at the appropriate stop-band frequency remains trapped and unable to escape, unless additional defects provide a path for this to occur. For optical wavelength cavities, the creation of the defects in two dimensional structures is much simpler than in self assembled three dimensional structures. While a large number of these self assembled PBGs have been fabricated, the deliberate placing of defects to create cavities with high Qs, and the placement of additional defects to allow trapped radiation to escape has been extremely difficult to achieve.

The present invention provides a novel technique of creating a defect in the form of a waveguide within a self organized PBG. A silica-sphere self assembled PBG is created from a colloidal suspension of spheres which settle to form an opal, in the face centered cubic (fcc) form. However, because of the periodicity of the spheres, the structure becomes a photonic band gap structure. As discussed above, the colloidal crystals with spheres, "opals", only provides pseudo-stop and pseudo-pass band structures, and the inverted opals, with air/void spheres interconnected with material of a suitably high index show definite pass and stop-bands, and hence the great interest in these inverse opal structures. For these inverted opals, colloidal crystals are formed by packing uniform spheres into 3D arrays, typically face centered cubic (fcc) or hexagonal close packed structures. The interstitial space between spheres can be filled by a fluid, such as a liquid metal alkoxide (see, B. T. Holland, C. F. Blanford, A. Stein, Synthesis of Highly Ordered Three-Dimensional Mineral Honeycombs with Macropores, Science, Vol. 281, pp. 538–540, 1998), or a salt solution (see, H. Yan, C. F. Blandford, B. T. Holland, W. H. Smyrl, A. Stein, General Synthesis of Periodic Macro-porous Solids by Templated Salt Precipitation and Chemical Conversion, Chem. Mater., Vol. 12, pp. 1134–1141, 2000) or other material (see, J. E. G. J. Wijnhoven, W. L. Vos, Preparation of photonic crystals made of air spheres in Titania, Science, Vol. 281, pp. 802–804, 1998). The fluid is subsequently converted into a solid skeleton by sol-gel reactions or precipitation processes. Alternatively, the interstitial spaces are filled with a semiconductor such as Silicon using low pressure CVD (see, D. J. Norris, Y. A. Vlasov, Chemical Approaches to Three-Dimensional Semiconductor Photonic Crystals, Advanced Materials, Vol. 13, Issue 6, pp. 371–376, 2001) or other process. In a final step, the spheres are removed by extraction or dissolution, for example by applying an acid, and the result is a matrix of air holes in a chosen material, a structure useful for PBGs. If the refractive index of the skeleton is high, one obtains a stop-band. A fcc 3D structure requires refractive. index of greater than 2.8 for the walls with air voids to obtain a complete stop-band, and also needs to have a low defect crystal structure (see, F. J. P. Schuurmans, D. Vanmaekelbergh, J. van de Lagemaat, A. Lagendijk, Strongly Photonic Macroporous Gallium Phosphide Networks." Science Vol. 284, pp. 141–143, 1999). However, a problem with these structures for device applications is that these fills are generally polycrystalline and result in significant scattering of light.

In one aspect of the present invention, a new technique is provided for obtaining single spherical particles for use in making opal structures. In one aspect, a seeding technique is used to synthesize silica spheres of about 710 nm diameters with a pseudo-stop-band at 1550 nm wavelength (see, G. H. Bogush, M. A. Tracy, C. F. Zukoski IV, "Preparation of monodisperse silica particles: Control of size and mass fraction", J. Non-Crystalline Solids, vol. 104, pp. 95–106, 1988 and S. L. Chen, P. Dong, G.-H. Yang, J.-J. Yang, "Characteristic aspects of formation of new particles during the growth of monosize silica seeds", Journal of Colloid and Interface Science, vol. 180, pp. 237–241, 1996). First, seeds are synthesized by the modified Stöber method (see, W. Stober, A. Fink, E. Bohn, "Controlled growth of monodisperse silica spheres in the micron size range", J. Colloid and Interf. Sci., vol. 26, pp. 62–69, 1968 and D. W. McComb, B. M. Treble, C. J. Smith, R. M. De La Rue and N. P. Johnson, "Synthesis and characterization of photonic crystals", J. Mater. Chem., vol. 11, pp. 142–148, 2001), using hydrolysis and condensation of tetraethylorthosilicate (TEOS, 0.2 M) and water (6.0 M) catalyzed by ammonia (1.8M) in ethanol solutions under constant agitation with magnetic stirrer and reaction temperature (20.0±0.2° C.). After preparing the seeds, TEOS additions with initial amount (0.2 M) are repeated under the same reaction conditions and constant intervals (4 hrs). The number of TEOS additions (k) can be selected based upon by the required final silica sphere diameter ($D_f$) and the measured diameter of seeds ($D_s$=375 nm±2.8%), form the equation:

$$D_f = \sqrt[3]{(1+k) \times D_s^3} \qquad \text{EQ. 1}$$

Figure 2:
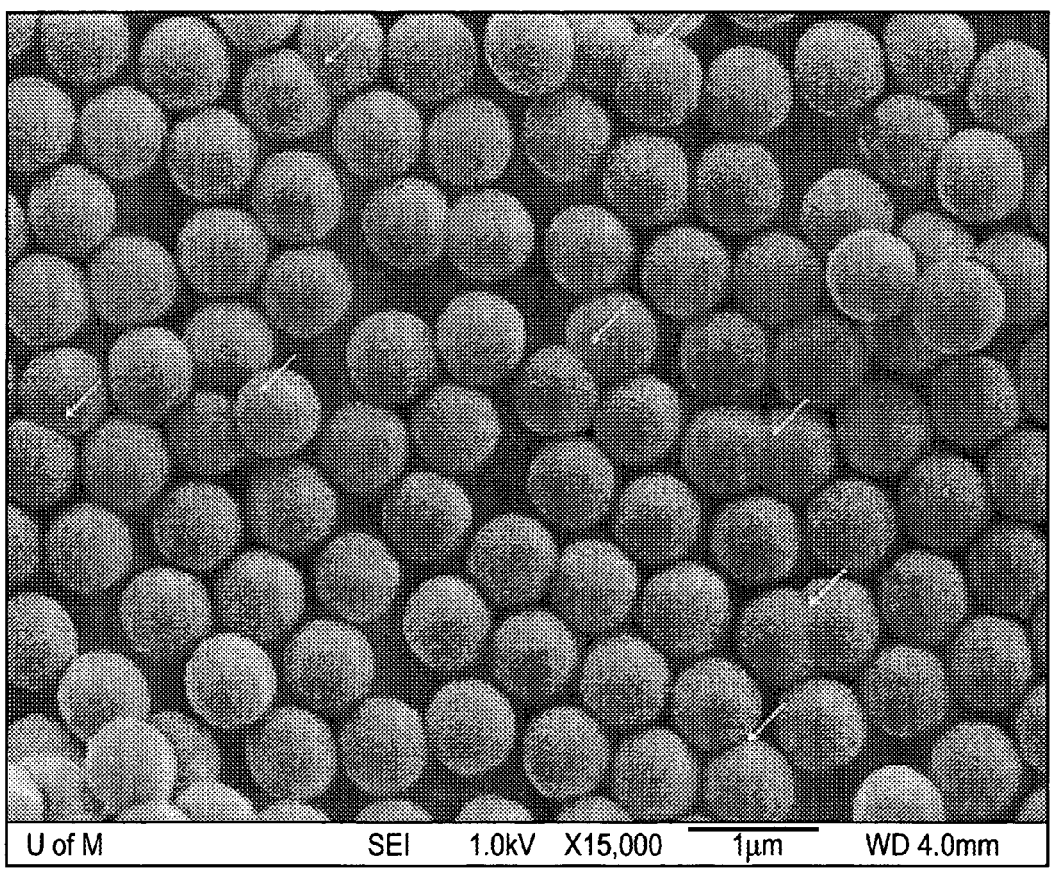
FIG. 2 is a top plan view showing an SEM (Scanning Electron Microscope) image of silica spheres in a colloidal suspension before a slow agitation reaction and a centrifugation collection.
Figure 3:
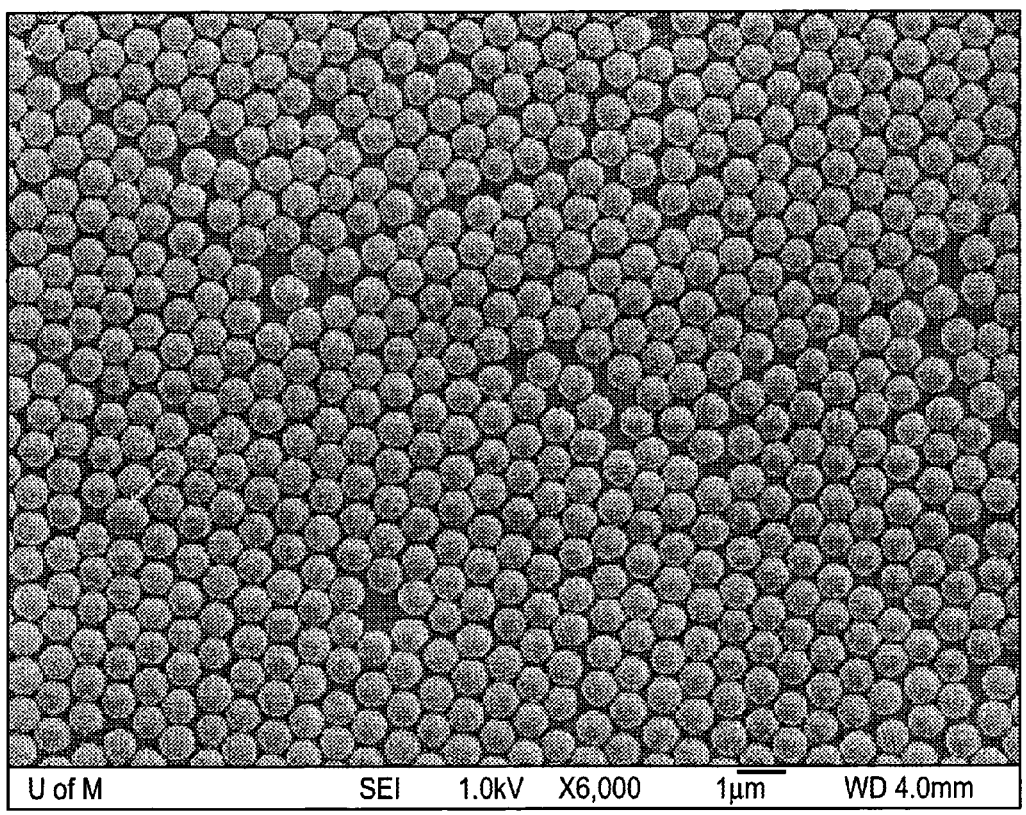
FIG. 3 is a top plan view showing an SEM (Scanning Electron Microscope) image of silica spheres in a colloidal suspension after a slow agitation reaction and a centrifugation collection.

FIG. 1 is a graph of the diameter of silica spheres in nanometers and standard deviation in percentage versus the number of TEOS additions. The spheres were formed using a slow agitation reaction and collection using a centrifuge. $D_s$ is 375 nm plus/minus 2.8%, $D_f$ is 711 nm plus/minus 1.3% measured across 100 spheres using SEM images. As illustrated by FIG. 1, the average diameter of silica spheres measured by the scanning electron microscope in good agreement with the calculated diameters as a function of TEOS additions using Equation 1. FIG. 2 is an SEM image of silica spheres in colloidal suspension before a slow agitation reaction and a centrifugation collection and FIG. 3 is an SEM image after slow agitation reaction and centrifugation collection. As illustrated in FIG. 2A, a number of spheres are aggregated or adhered (8.8%). However, after slow agitation and centrifugation collection (FIG. 3), only 0.3% of the spheres are aggregated or adhered.

In one aspect, the present invention provides a technique for harvesting single spheres. Two effective methods are used to prepare high quality silica spheres with reduced aggregation and adhesion. These methods are slow agitation and collection of single spheres with a centrifuge. The slow agitation technique results in a lower probability of collisions between silica spheres. This yields a colloidal suspension having adhered spheres of 3%. In the centrifugation technique, single spheres are collected using the relative difference of sedimentation velocity between singles and doublets with centrifugal force. A separated region with only single spheres can be obtained, using partial sedimentation with the centrifuge. This is a much more effective and faster method than the one using gravitational field (see, P. Ni, P. Dong, B. Cheng, X. Li, D. Zhang, "Synthetic SiO2 opals", Adv. Mater. vol. 13, pp. 437–441, March 2001). Using these methods, high quality silica spheres can be obtained such as those shown in FIG. 3 having a greatly reduced number of adhered or aggregate spheres of only 0.3%.

Once the high quality silica spheres are obtained, they can be used to prepare opal structures. These silica spheres are put in a colloidal suspension with a controlled volume fraction in ethanol and used to coat a Silicon substrate. A coating method using a capillary force at the meniscus of the liquid is used in which the convection of the colloidal suspension by heating is employed to avoid the sedimentation of silica spheres. (See, Y. A. Vlasov, X.-Z. Bo, J. C. Sturm, D. J. Norris, "On-chip natural assembly of silicon photonic bandgap crystals", Nature, vol. 414, pp. 289–293, November, 2001 and P. Jiang, J. F. Bertone, K. S. Hwang, V. L. Colvin, "Single-crystal colloidal multilayers of controlled thickness", Chem. Mater., vol. 11, pp. 2132–2140, 1999.) In this method, the Silicon substrate is slowly removed from the colloidal suspension while the suspension is heated. As the substrate is drawn through the meniscus of the liquid, silica spheres are deposited on the substrate in a three-dimensional crystal matrix. However, if the substrate is drawn out at an angle which is generally perpendicular to the plane of the liquid, the deposition of silica spheres across the substrate is nonuniform. It is believed that this is due to the increasing concentration of silica spheres in the colloidal suspension as the ethanol evaporates.

Figure 4:
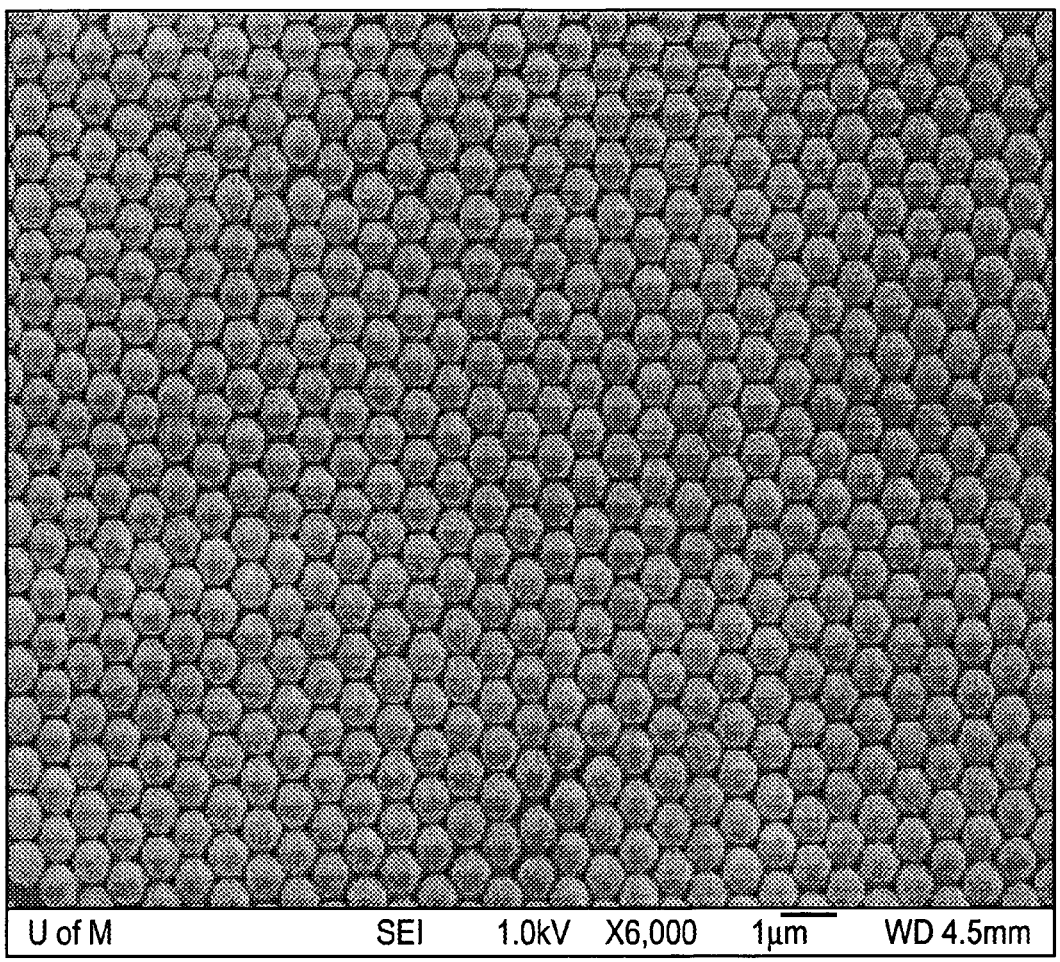
FIG. 4 is an SEM image of a top view of a crystalline opal structure with a hexagonal close-packed lattice.
Figure 5:
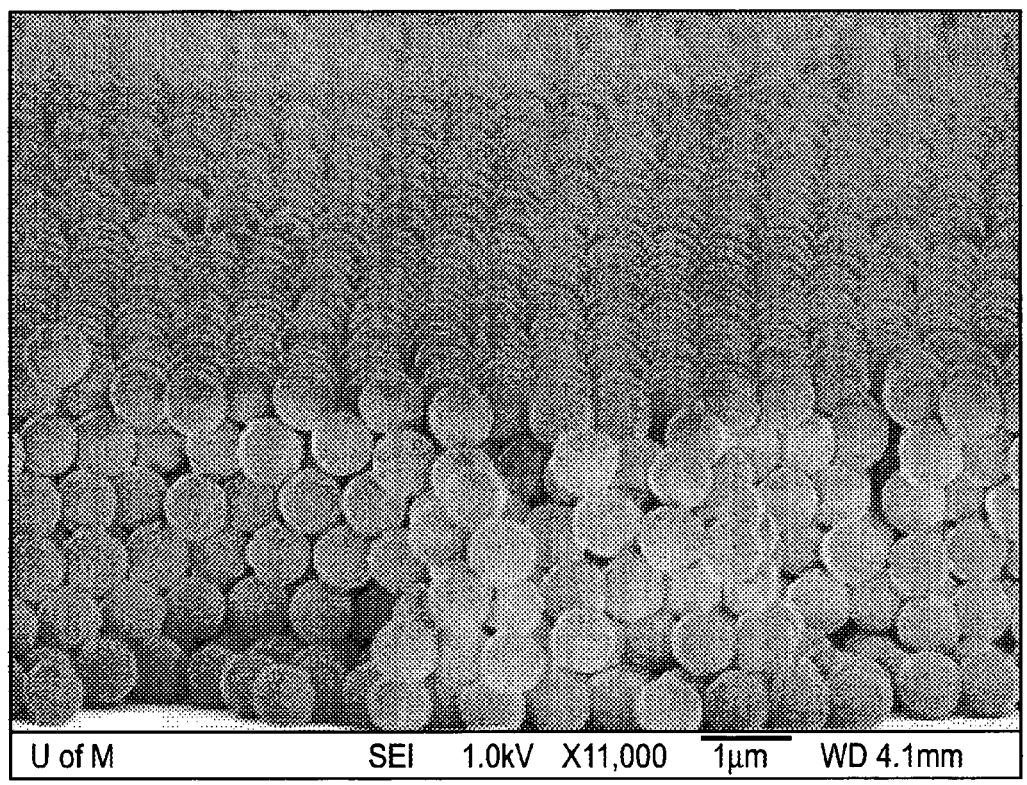
FIG. 5 is a cross-sectional SEM image of a sample having six layers of spheres.
Figure 6:
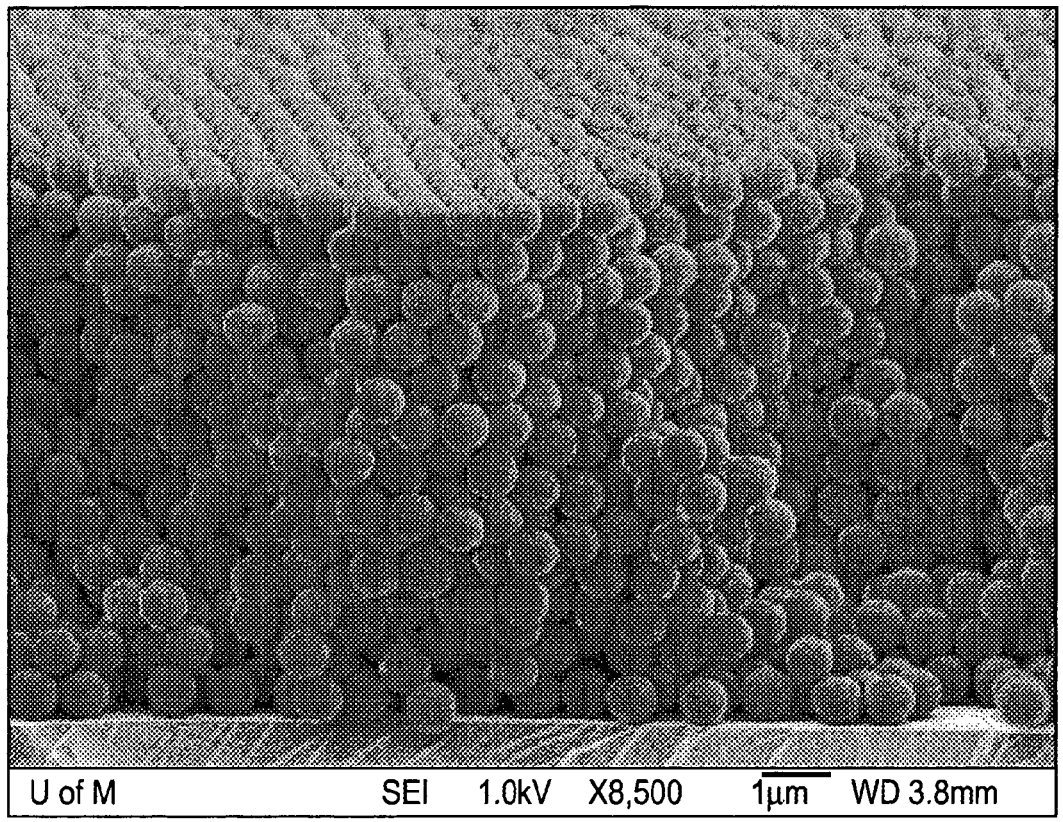
FIG. 6 is a cross-sectional SEM image of a sample having thirteen layers of spheres.

With the present invention, the Silicon substrate is placed at an angle as it is removed from the colloidal suspension through the meniscus. In a preferred embodiment, the angle is a declination at 60° measured relative to the plane of the substrate. However, an optimal angle can be selected as desired and may range between about 55° and about 65°. In one specific embodiment, an evaporation temperature of 60° C. is used and a declined substrate angle in the colloidal suspension of 60° is provided. This configuration provides a very uniform crystal opal on a 1 cm by 3 cm Silicon substrate. This is illustrated in FIGS. 4, 5 and 6 which are, respectively, a top view of an opal with hexagonal closely packed lattice structure, a cross-sectional view of one sample substrate with six layers and a cross-sectional view of another sample substrate with thirteen layers of spheres.

The thickness of the opals can be controlled by varying the concentration of silica spheres in the colloidal suspensions.

Figure 7:
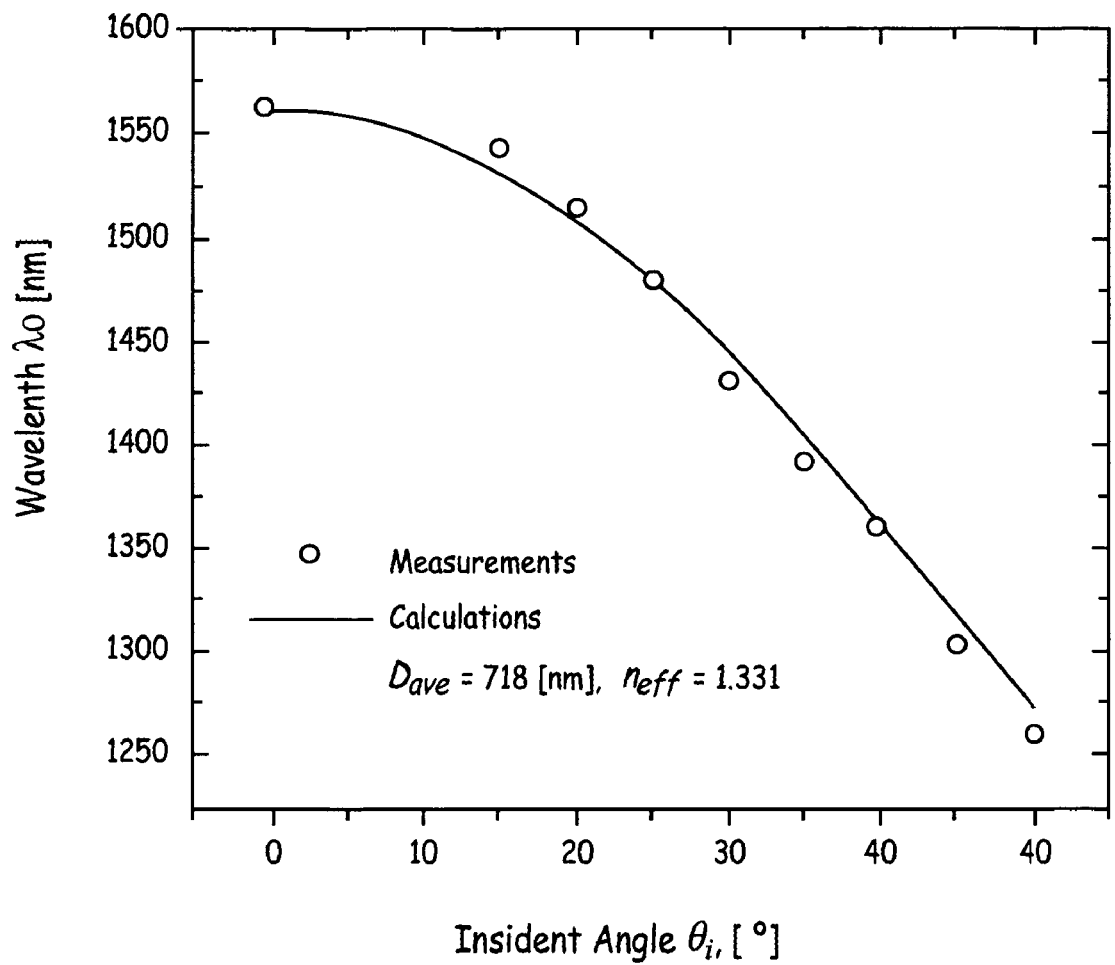
FIG. 7 is a graph of wavelength of maximum reflectance versus incident angle.

Using a Fourier transform infrared (FTIR) spectrometer with white light source, the reflectance spectrum of opals can be measured at various angles of incident light ($\theta_i$). FIG. 7 is a graph of wavelength $\lambda_0$ versus incident angle and shows the measured and calculated positions of the maximum peak ($\lambda_0$) of the reflectance spectra, which represent the photonic stop-band behavior, depending upon incident angle. The calculated wavelengths of maximum reflectance peak can be estimated by following equations, which combines Bragg's and Snell's laws (see, D. W. McComb, B. M. Treble, C. J. Smith, R. M. De La Rue and N. P. Johnson, "Synthesis and characterization of photonic crystals", J. Mater. Chem., vol. 11, pp. 142–148, 2001 and C. F. Blanford, R. C. Schroden, M. Al-Daous, A. Stein, "Tuning solvent-dependent color changes of three-dimensionally ordered macroporous (3DOM) materials through compositional and geometric modifications", Adv. Mater., vol. 13, pp. 26–29, January, 2001):

$$\lambda_0 = \frac{2d_{hkl}}{m_B}\sqrt{n_{eff}^2 - n_{air}^2 \sin^2\theta_i} \qquad \text{EQ. 2}$$

$$n_{eff} = \phi n_{sio2} + (1-\phi)n_{air} \qquad \text{EQ. 3}$$

where $d_{hkl}=\sqrt{2}D/\sqrt{3}$ is the inter-planar spacing for (111) planes, D is the silica sphere diameter, $m_B$ is the order of the Bragg reflection, $\theta_i$ is the Bragg angle measured from the normal to the planes, $n_{eff}$ is the effective refractive index, $\Phi=0.74$ is the volume fraction of silica spheres in the opals and $n_{sio2}=1.447$ and $n_{air}=1.0$ are the refractive index of silica and air, respectively.

Figure 8:
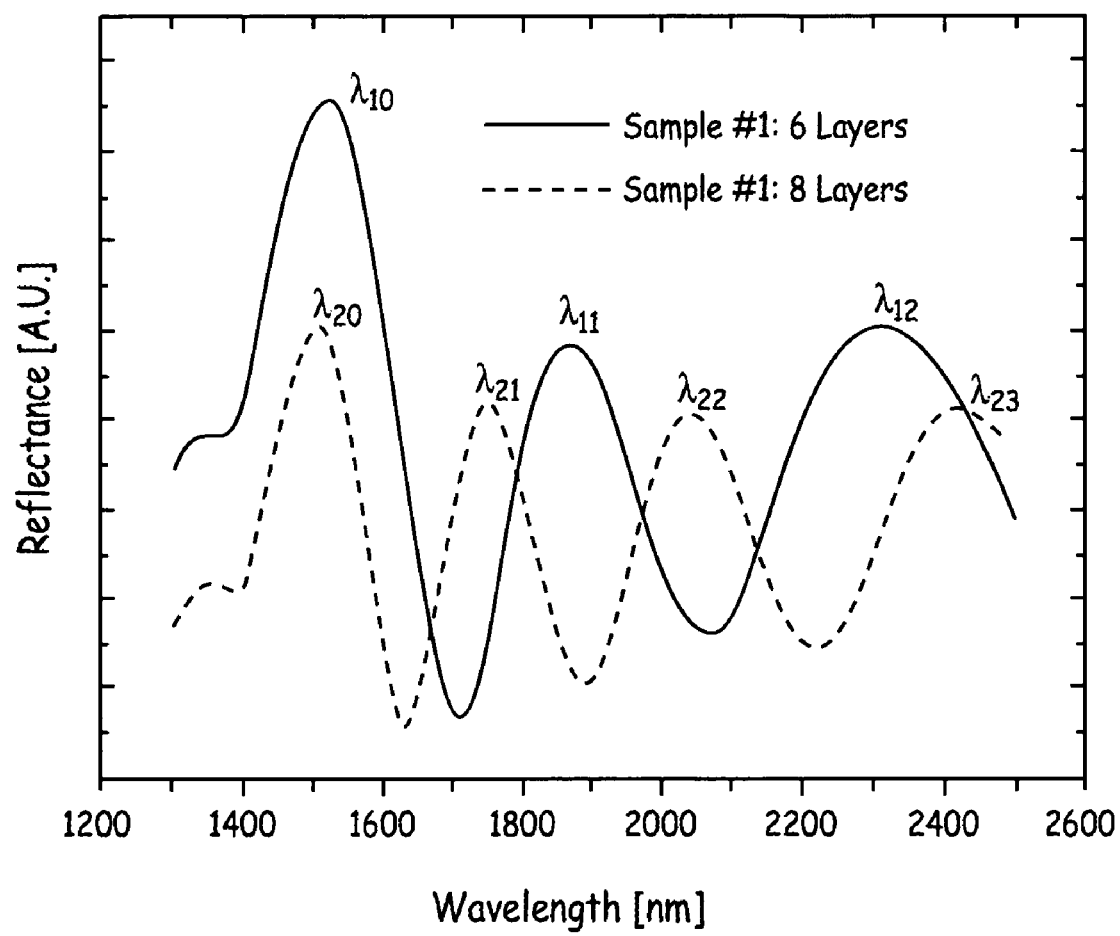
FIG. 8 is a graph of reflectance versus wavelength.
Figure 9:
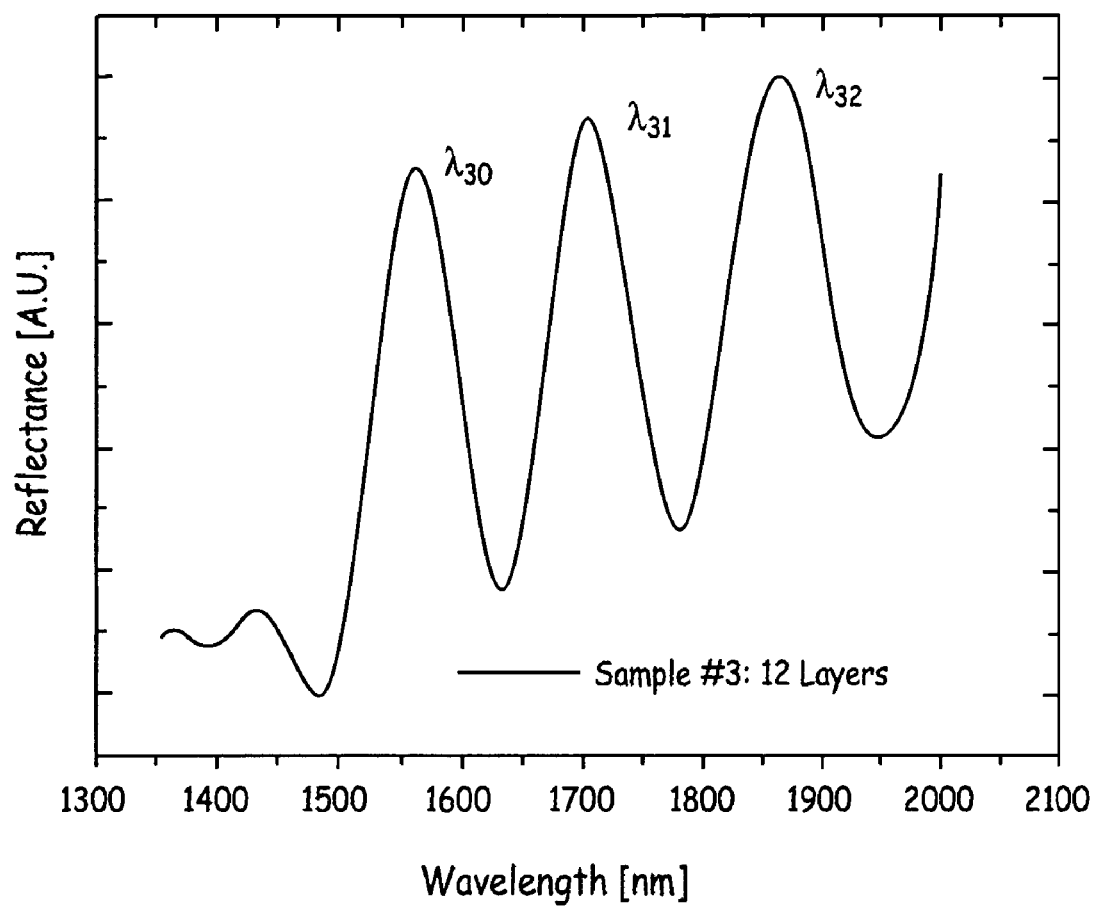
FIG. 9 is a graph of reflectance versus wavelength.

FIG. 8 is a graph of reflectance versus wavelength for two samples having six and eight layers and FIG. 9 is a graph of reflectance versus wavelength for a sample having 12 layers at $\theta_i=0°$ where $\lambda_{pq}$ represents the wavelength of sample number p and the $q^{th}$ reflectance peak. The average diameters of the spheres are shown below at Table 1. Based on the interference phase condition (2 kT–2 m$\pi$, where k=2$\pi n_{eff}/\lambda$ can be calculated by the equation:

$$\lambda_q = \frac{2n_{eff}T}{m} = \frac{2n_{eff}Nd_{hkl}}{m} \qquad \text{EQ. 4}$$

where N is the number of layers. In the calculations of wavelengths of $q^{th}$ peak, arbitrary positive integers are used in m and N. The theoretical and experimental wavelengths of $q^{th}$ peak are compared in the Table 1. Using the SEM cross section images of samples, such as shown in FIGS. 5 and 6, it is possible to compare the calculated and measured number of layers to ensure that they are in good agreement.

Table 1. Characterization Results of the Wavelengths of $q^{th}$ Peak and the Number of Silica Sphere Layers.

TABLE 1

| Sample #p | $D_{ave}$ [nm] | N | m | q | $\lambda_{cal,pq}$ [nm] | $\lambda_{meas,pq}$ [nm] | $\|\lambda_{meas,pq} - \lambda_{cal,pq}\|$ [nm] |
|---|---|---|---|---|---|---|---|
| 1 | 696 | 6 | 6 | 0 | 1512 | 1525 | 13 |
| | | | 5 | 1 | 1814 | 1870 | 56 |
| | | | 4 | 2 | 2268 | 2315 | 47 |

TABLE 1-continued

| Sample #p | $D_{ave}$ [nm] | N | m | q | $\lambda_{cal,pq}$ [nm] | $\lambda_{meas,pq}$ [nm] | $\|\lambda_{meas,pq} - \lambda_{cal,pq}\|$ [nm] |
|---|---|---|---|---|---|---|---|
| 2 | 696 | 8 | 8 | 0 | 1512 | 1510 | 2 |
|   |     |   | 7 | 1 | 1728 | 1750 | 22 |
|   |     |   | 6 | 2 | 2016 | 2038 | 22 |
|   |     |   | 5 | 3 | 2419 | 2424 | 5 |
| 3 | 718 | 12 | 12 | 0 | 1560 | 1562 | 2 |
|   |     |    | 11 | 1 | 1701 | 1706 | 5 |
|   |     |    | 10 | 2 | 1872 | 1865 | 7 |

The present invention includes the self assembly of colloidal opals and inverse opal photonic bandgap structures and their use in the creation of a waveguide defect within the structures. A colloidal opal having a pseudo stop-band in a waveguide buried within is also provided by the present invention. The waveguides can be formed in a variety of different materials and are preferably designed to provide a single mode of operation with normal waveguiding and some additional loss due to the presence of the surrounding opal. At the pseudo stop-band wavelength, the structures become highly confined and may become multimode. These high confinement waveguides at the pseudo stop-band can be used as narrow band filters. For waveguides doped with Erbium and optically pumped, the structure perform as an amplifier with improved performance at the stop-band. However, the possibility of higher amplified spontaneous emission noise will remain and will improve at the stop-band. Er doped waveguides with etched gratings at both ends can be optically pumped and will operate as lasers. These structures are more efficient at the pseudo stop-band.

It is believed that an inverse opal with a defect in the form of a waveguide can obtain pass and stop-bands and will allow highly efficient filters to be developed. A defect in the form of a rare earth doped waveguide in this PBG, with etched gratings at both ends, acts as a low threshold photonic bandgap waveguide laser when optically pumped since at the stop-band the spontaneous emission from the inverted rare-earth carries does not escape from the waveguide. Since the PBG prevents the spontaneous emission from escaping, this structure also becomes a highly efficient wide band Amplified Spontaneous Emission (ASE) source. While low transparency amplifiers are also possible, however, the high level of amplified spontaneous emission may degrade performance. These inverse opals with air or low dielectric holes and the filling of generally high index material including semiconductors (see, D. J. Norris, Y. A. Vlasov, Chemical Approaches to Three-Dimensional Semiconductor Photonic Crystals, Advanced Materials, Vol. 13, Issue 6, pp. 371–376, 2001) have these buried waveguide defects. As indicated above, the contrast ratio needs to exceed 2.8 between the filling and the spheres/holes to obtain stop-bands.

Figure 10A:
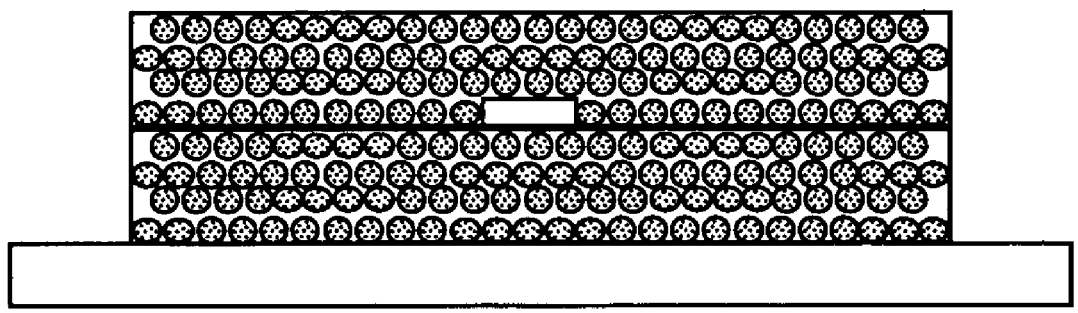
FIG. 10A is a cross-sectional diagram of a buried waveguide in an opal structure.
Figure 10B:
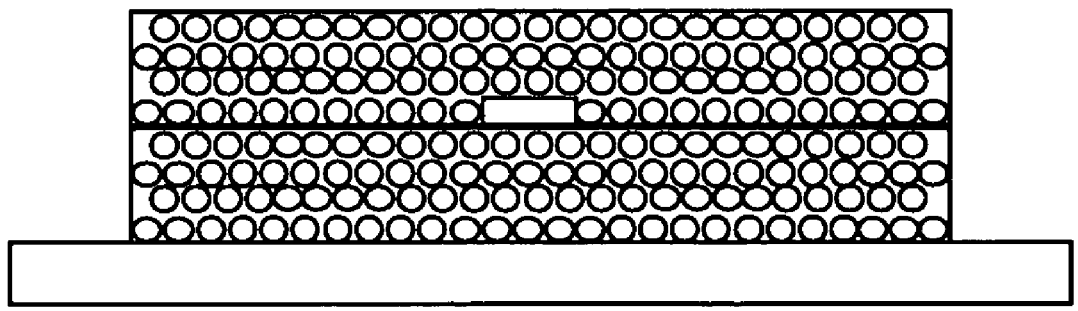
FIG. 10B is a cross-sectional diagram of a buried waveguide in an inverse opal structure.

FIG. 10A is a cross-sectional diagrammatical view of an opal structure 10 carried on a Silicon substrate 12 including a buried waveguide 14. FIG. 10B shows an inverse opal structure 20 on a Silicon substrate 22 carrying a buried waveguide 24 therein. The silica opal and the Silicon inverse opal structures can be designed using simulations, for example based upon published codes (see, S. G. Johson, J. D. Joanopoulos, Block iterative frequency domain method for Maxwell's equations in a plane wave basis, Opt. Express, Vol. 8, 173–190, 2001 and P. M. Bell, J. M. Pendry, I. Martin-Moreno, A. J. Ward, A program for calculating photonic band structures and transmission coefficients of complex structures, comput. Phys. commun., Vol. 85, pp. 306–322, 1995) or by using commercial software such as Fullwave Finite Difference Time Domain (FFDTD) available from Rsoft.

As discussed above, high quality crystal opals must be formed using spheres having a required diameter and narrow size distribution. The diameter determines the wavelength of the photonic bandgap (or the maximum reflectance peak on the optical spectrum). Aggregations and adhesions between the spheres should be avoided as they introduce structural defects and dislocations into the final crystal. As discussed above, a tetraethyl orthosilicate (TEOS) method is used as suggested by Stöber (see, W. Stöber, A. Fink, Controlled growth of monodispersed silica spheres in the micron size range, J. Colloid. Interface Sci., vol. 26, pp. 62, 1968) and now called the Stöber process, with modifications as outlined in (G. H. Bogush, M. A. Tracy, C. F. Zukoski IV, Preparation of monodisperse silica particles: Control of size and mass fraction, J. Non-Crystalline Solids, vol. 104, pp. 95–106, 1988, S. L. Chen, P. Pong., G. H. Yang, J. J. Yang, Characteristic aspects of formation of new particles during growth of monosize silica seeds, J. Colloid. Interface Sci., vol. 180, pp. 237–241, 1996, and D. W. McComb, B. M. Treble, C. J. Smith, R. M . De La Rue, N. P. Johnson, Synthesis and characterization of photonic crystals, J. Mater. Chem., Vol. 11, pp. 142–148, 2001). The technique involves the mixing of two mother liquors of TEOS-ethanol and ammonia-water-ethanol and generally leads to spheres in the range of 300 nm to 450 nm diameter, depending on various factors. In one trial, a sphere size of about 350 nm was obtained. A modified seeding technique can also be used as discussed in Chen's paper (S. L. Chen, P. Pong, G. H. Yang, J. J. Yang, Characteristic aspects of formation of new particles during growth of monosize silica seeds, J. Colloid. Interface Sci., vol. 180, pp. 237–241, 1996). In this technique, the seeds are first synthesized by the modified Stöber method (see, J. G. Fleming, S-Y. Lin, Three dimensional photonic crystal with a stop-band from 1.35 to 1.95 µm, Optics Lett., vol. 24, pp. 49–51, 1999 and Special Section on Electromagnetic Crystal Structures, Design, Synthesis, and Applications, Journal of Lightwave Technology, Vol. 17, pp. 1931–2207, 1999), using hydrolysis and condensation of tetraethylorthosilicate (TEOS, 0.2 M) and water (6.0 M) catalyzed by ammonia (1.8 M) in ethanol solutions under constant agitation and with a magnetic stirrer and reaction temperature of 20° plus or minus 0.2° C. After preparation, TEOS additions (initially 0.2 M) were repeated under the same reaction condition and constant intervals (4 hrs). The sphere diameter is set forth above at Equation 1. Separation techniques can be employed as discussed above to reduce the number of adhered spheres.

The silica opal should be fabricated with very few crystal defects, especially stacking faults, as discussed in (D. J. Norris, Y. A. Vlasov, Chemical Approaches to Three-Dimensional Semiconductor Photonic Crystals, Advanced Materials, Vol. 13, Issue 6, pp. 371–376, 2001). Opals with other spheres may also be fabricated using this technique. Although a Silicon substrate is discussed herein, any appropriate material can be used.

A silica colloidal opal structure can be obtained when a suspension of the mono-dispersed silica spheres are allowed to settle on the Silicon substrate. A meniscus method can be used as discussed above to reduce crystalline defects. The declination configuration discussed above can be used to increase the uniformity of the crystal.

Figure 11:
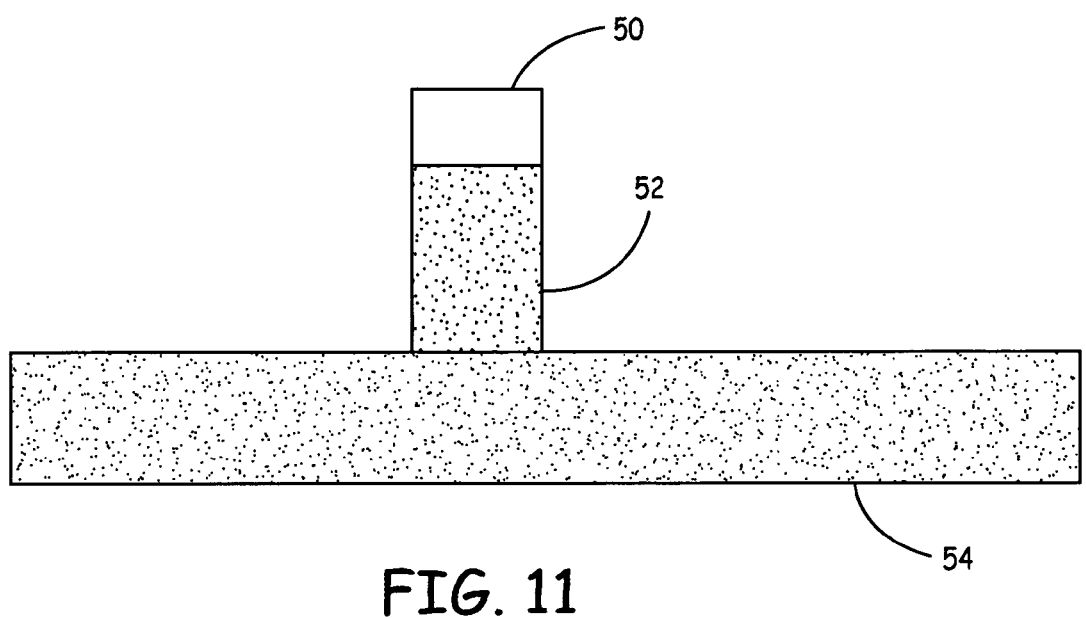
FIG. 11 is a side plan view of a substrate carrying an optical guide supported on either a rib or pillar structure.
Figure 12:
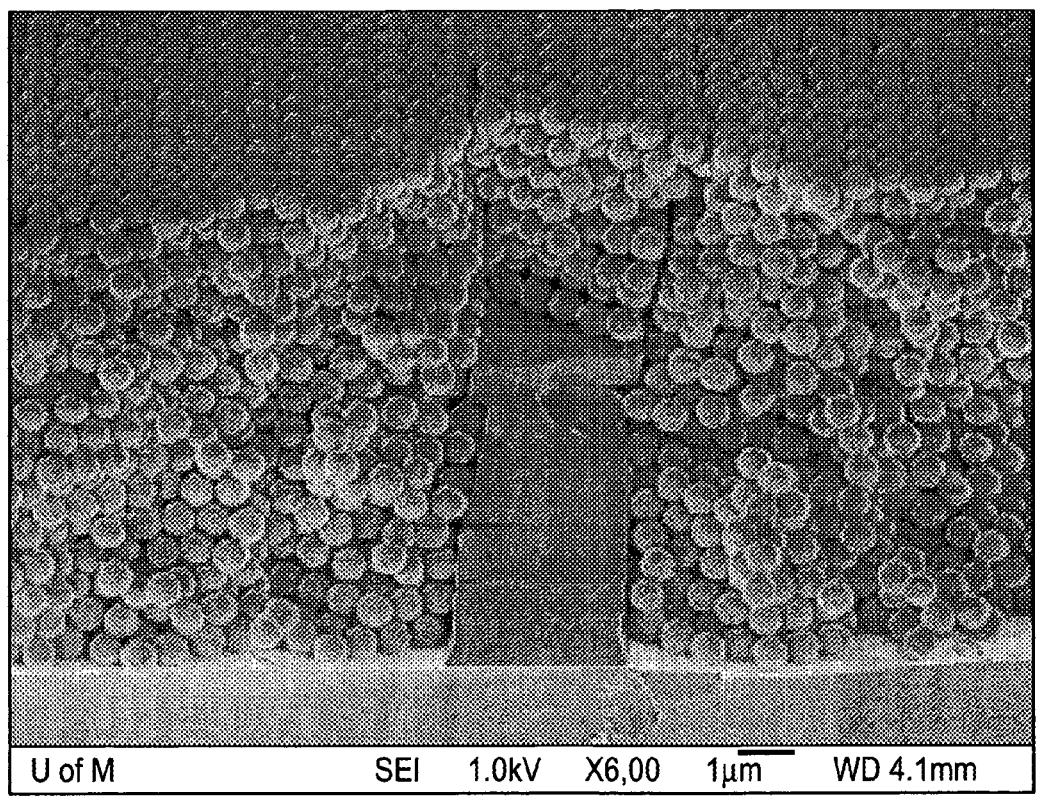
FIG. 12 is a cross-sectional SEM image of a silicon nitride waveguide supported on a silica rib buried in a colloidal opal. A portion of the waveguide is unsupported and is not shown in FIG. 12.

In one aspect, the present invention includes an optical waveguide carried within an opal structure, either opal or inverse opal. Any appropriate technique can be used to obtain such a buried waveguide. However, in a first example method, as illustrated in FIG. 11 an optical waveguide 50 is supported on a silica rib 52 carried on the Silicon substrate 54. The waveguide can be any desired structure such as Erbium doped silicon. The supporting structure 52 can be an elongated rib or can comprise one or more spaced apart pillars. These can be formed using any appropriate technique such as using deposition and masking techniques to form the desired supporting structure. Similarly, any desired appropriate technique can be used to deposit the waveguide 50. Around the waveguide, the colloidal opal is deposited using, for example, the techniques discussed above. FIG. 12 is an SEM image showing a cleaved opal structure having a waveguide buried therein. The guide provides a pseudo stop-band and can be designed to remain single or multimode as desired. Surprisingly, the top surface of the opal is substantially planar and does not include substantial protrusions despite the introduction of the buried waveguide. If an active guide is used, Erbium or other materials can be doped into the guides during deposition, or alternatively through implantation. The presence of Erbium can be used in the fabrication of high gain lasers because some of the spontaneous emission at the stop-band wavelengths will be coupled back into the guide. It is expected that this increase is more dramatic in an inverse opal structure. Reflectors can be placed at either end of the doped guides and pumped at the appropriate wavelength, for example 1480 nm, to provide a very low threshold laser.

The waveguide can also be used in an inverse opal structure. To form an inverse opal structure, the first step is to fill the interstitial spaces between the sphere of the previously fabricated opal structure. For example, Low Pressure Chemical Vapor Deposition (LPCVD) amorphous silicon can be used to fill the voids. A colloidal template will emerge from the LPCVD silicon deposition, covered with a thin layer of silicon. This thin layer of silicon must be etched to expose the underlying silica spheres. The spheres can then be removed by dissolution using dilute or buffered HF. It has been suggested that the deposition of silicon is best done at a slightly lower temperature of 550° C. so that complete penetration into the voids will occur. (See, Y. A. Vlasov, X.-Z. Bo, J. C. Sturm, D. J. Norris, On-chip natural assembly of silicon photonic bandgap crystals, Nature, vol. 414, pp. 289–293, November, 2001).

Waveguides formed of a material having a dissolution rate in HF which is much lower than silica can be used. For example, LPCVD low stress nitride or nitride can be used. Alternatively, guides which dissolve, such as silica guides, can be used to leave an air guide with protruding sphere surfaces. This is likely to make the guides relative lossy. However, if the silica guide is coated with nitride of sufficient thickness on all sides, then the $S_iO_2$ guide will remain after removal of the silica spheres. The index of the inverse opal is estimated as 1.63, due to the fact that the air holes comprise of about 0.74 of the structure, and the remainder is Silicon.

Figure 13A:
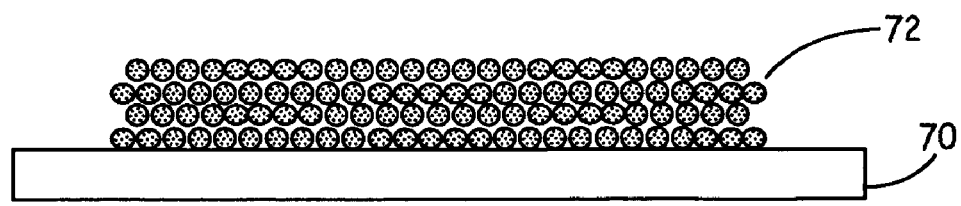
FIG. 13A is a side plan view of a substrate carrying an opal structure.
Figure 13B:
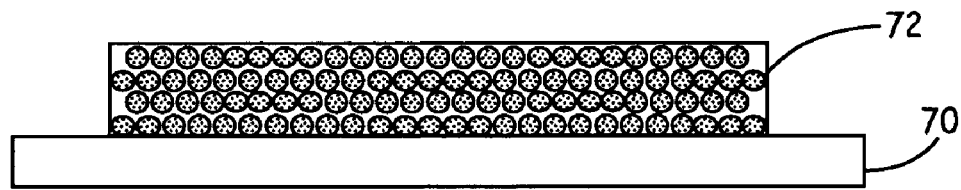
FIG. 13B is a side plan view of the structure of FIG. 13A following filling of the opal structure.
Figure 13C:
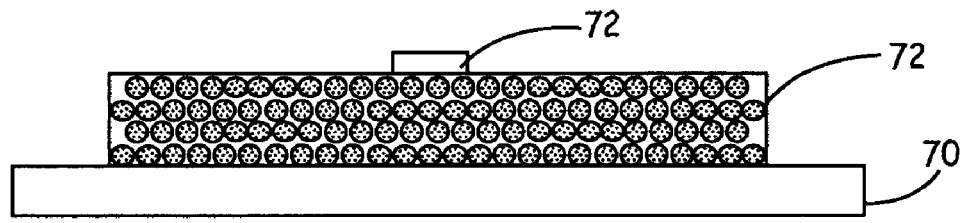
FIG. 13C is a side plan view of the structure of FIG. 13B following deposition of a waveguide.
Figure 13D:
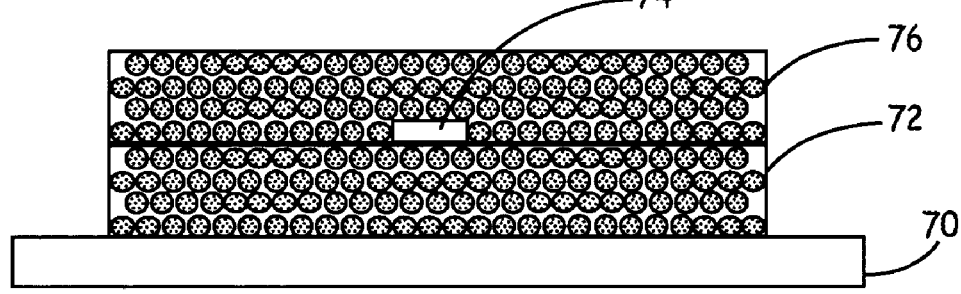
FIG. 13D is a side plan view of the structure of FIG. 13C following deposition of a second opal structure and filling of the opal structure.
Figure 13E:
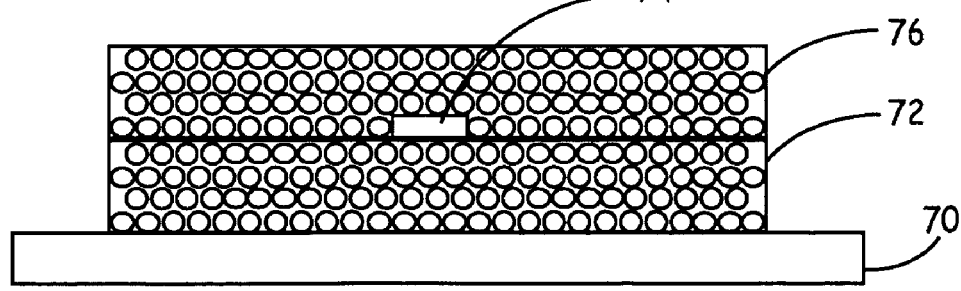
FIG. 13E is a side plan view of the structure of FIG. 13D following removal of silica spheres leaving an inverse opal structure with buried waveguide.

FIGS. 13A–E illustrate another example configuration for forming the buried waveguide. As shown in FIG. 13A, a substrate 70 carries a number of layers of opals 72. In FIG. 13B, the opal is filled with an inverse opal filling material. As illustrated in FIG. 13C, material to form a waveguide 74 is deposited and patterned on the structure. The waveguide on the filled opal is covered with another layer of opal 76 which is subsequently filled as illustrated in FIG. 13D. As illustrated in FIG. 13E, the opal is etched leaving an inverse opal structure 78. The waveguide can then act as a filter at the stop-bands of the inverse opal. As discussed above, the guide can be doped with a rare earth material, such as Erbium or other elements, to provide lasers, optical amplifiers, optical spontaneous emission sources, or other devices.

Although the present invention has been described with reference to preferred embodiments, workers skilled in the art will recognize that changes may be made in form and detail without departing from the spirit and scope of the invention.

What is claimed is:

1. A method of obtaining single spheres for use in making self assembled opal structures, comprising:
    obtaining a plurality of spherical particles;
    placing the spherical particles in a centrifuge; spinning the centrifuge to apply centrifugal force to the spherical particles; and
    separating single spheres from doublets using a relative difference in sedimentation velocity in response to centrifugal force.

2. The method of claim 1 including depositing the single spheres onto a substrate.

3. The method of claim 2 wherein the depositing comprising placing the substrate in a fluid containing the single spheres and drawing the substrate through a meniscus of the fluid at a declination angle between the substrate and the meniscus.

4. The method of claim 1 including forming a three-dimensional photonic crystal with the single spheres.

5. The method of claim 4 including providing a waveguide within the three-dimensional photonic crystal.

6. A method of making a three-dimensional photonic crystal comprising:
    providing a plurality of spheres carried in a suspension;
    drawing a substrate through a meniscus formed in the suspension and at a declination angle relative to the meniscus.

7. The method of claim 6 wherein the angle is about 60°.

8. The method of claim 6 including burying a waveguide within the photonic crystal structure.

9. A method of making a photonic crystal structure including a waveguide, comprising:
    placing a raised waveguide support on a substrate;
    placing a waveguide on the raised waveguide support;
    burying the waveguide in a photonic bandgap crystal.

10. The method of claim 9 including forming an inverse opal structure.

11. A method of making a three-dimensional photonic crystal including a buried waveguide, comprising:
    depositing a first layer of photonic crystal on a substrate;
    depositing a waveguide on the first layer of photonic crystal;
    depositing a second layer of photonic crystal on the first layer of photonic crystal and the waveguide.

12. The method of the claim 11 including forming an inverse opal structure in the photonic crystal.

* * * * *